(12) United States Patent
Avanzino et al.

(10) Patent No.: US 7,384,800 B1
(45) Date of Patent: Jun. 10, 2008

(54) METHOD OF FABRICATING METAL-INSULATOR-METAL (MIM) DEVICE WITH STABLE DATA RETENTION

(75) Inventors: Steven Avanzino, Cupertino, CA (US); Sameer Haddad, San Jose, CA (US); An Chen, Sunnyvale, CA (US); Yi-Ching Jean Wu, Sunnyvale, CA (US); Suzette K. Pangrle, Cupertino, CA (US); Jeffrey A. Shields, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/633,942

(22) Filed: Dec. 5, 2006

(51) Int. Cl.
*H01L 21/00* (2006.01)
(52) U.S. Cl. .......................... 438/3; 438/570; 438/582; 438/608; 438/785; 257/E21.104; 257/E21.202; 257/E21.295; 257/E51.007
(58) Field of Classification Search .................. 438/3; 204/1
See application file for complete search history.

(56) References Cited

U.S. PATENT DOCUMENTS

| | | | | |
|---|---|---|---|---|
| 5,434,363 A | * | 7/1995 | Goto et al. | 174/256 |
| 5,442,224 A | * | 8/1995 | Yoshimizu et al. | 257/536 |
| 5,672,251 A | * | 9/1997 | Goto et al. | 204/192.17 |
| 6,396,147 B1 | * | 5/2002 | Adachi et al. | 257/758 |
| 6,743,678 B2 | * | 6/2004 | Lee et al. | 438/257 |
| 6,928,720 B2 | * | 8/2005 | Kobayashi et al. | 29/594 |
| 6,936,877 B2 | * | 8/2005 | Klee et al. | 257/296 |
| 6,946,341 B2 | * | 9/2005 | Joo et al. | 438/240 |
| 2004/0102015 A1 | * | 5/2004 | Choi et al. | 438/396 |
| 2006/0066598 A1 | * | 3/2006 | Floyd | 345/204 |
| 2006/0114380 A1 | * | 6/2006 | Kurashima | 349/114 |

\* cited by examiner

*Primary Examiner*—Walter Lindsay, Jr.
*Assistant Examiner*—Abdulfattah Mustapha

(57) ABSTRACT

In the method of fabricating a metal-insulator-metal (MIM) device, a first electrode of α-Ta is provided. The Ta of the first electrode is oxidized to form a $Ta_2O_5$ layer on the first electrode. A second electrode of β-Ta is provided on the $Ta_2O_5$ layer. Such a device exhibits strong data retention, along with resistance to performance degradation under high temperatures.

15 Claims, 8 Drawing Sheets

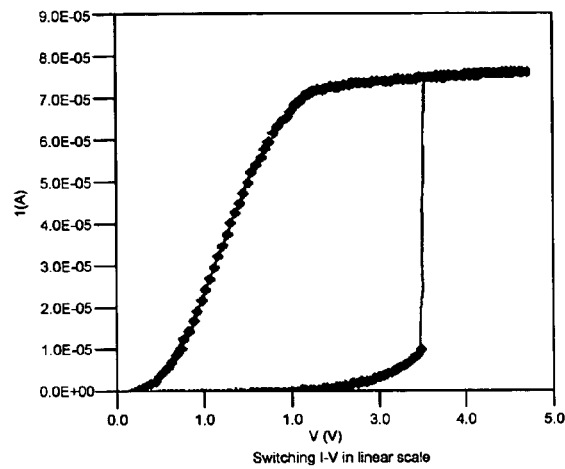
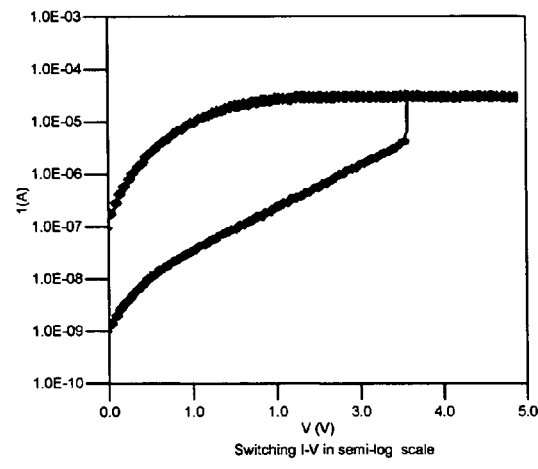
FIGURE 13
FIGURE 14
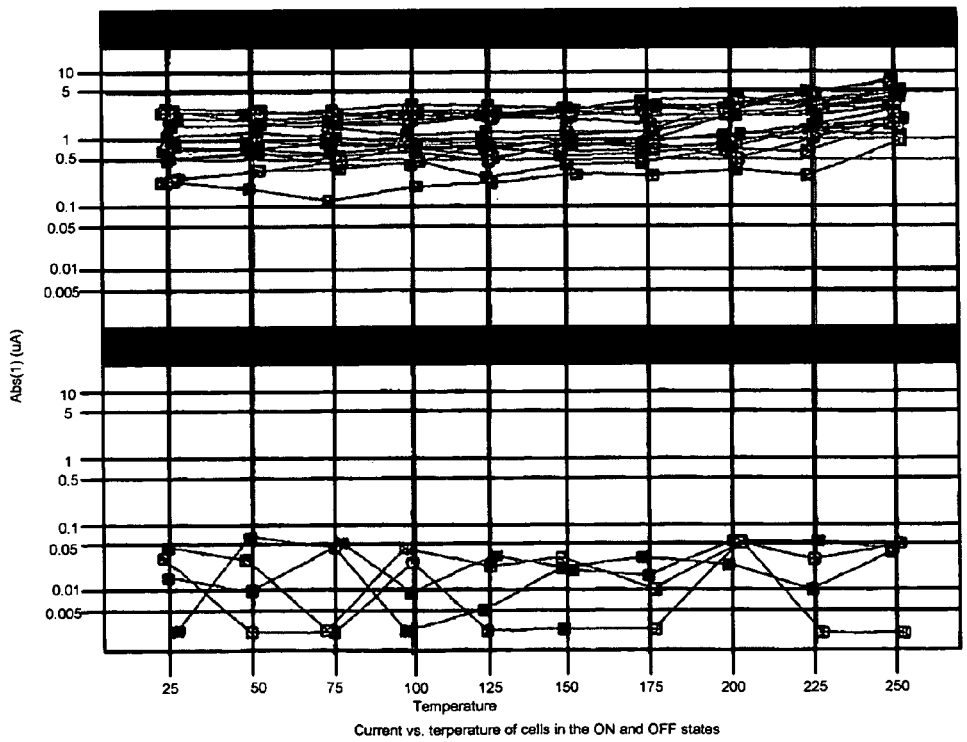
Current vs. temperature of cells in the ON and OFF states
FIGURE 15

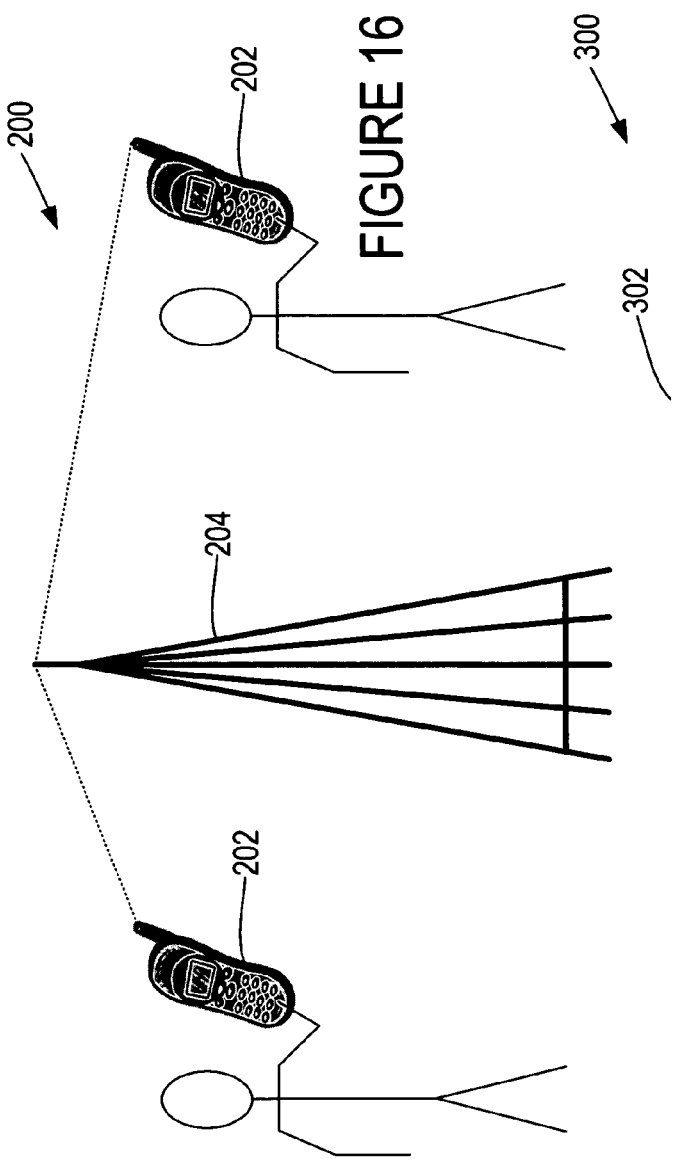
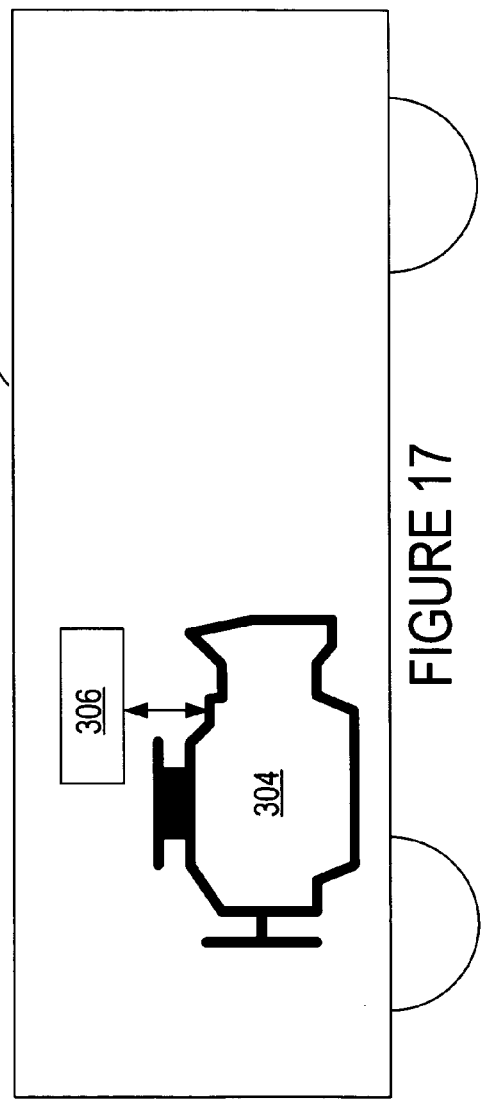

US 7,384,800 B1

METHOD OF FABRICATING METAL-INSULATOR-METAL (MIM) DEVICE WITH STABLE DATA RETENTION

BACKGROUND OF THE INVENTION

1. Technical Field

This invention relates generally to electronic devices, and more particularly, to a method of fabricating a Metal-Insulator-Metal (MIM) device.

2. Background Art

FIG. 1 illustrates a two-terminal metal-insulator-metal (MIM) resistive memory device 30. The memory device 30 includes a metal, for example copper electrode 32, an active layer 34 of for example copper oxide on and in contact with the electrode 32, and a metal, for example copper electrode 36 on and in contact with the active layer 34. As an example of the operational characteristics of such a device 30, with reference to FIG. 2, initially, assuming that the memory device 30 is unprogrammed, in order to program the memory device 30, ground is applied to the electrode 32, while a positive voltage is applied to electrode 36, so that an electrical potential $V_{pg}$ (the "programming" electrical potential) is applied across the memory device 30 from a higher to a lower electrical potential in the direction from electrode 36 to electrode 32. Upon removal of such potential the memory device 30 remains in a conductive or low-resistance state having an ON-state resistance.

In the read step of the memory device 30 in its programmed (conductive) state, an electrical potential $V_r$ (the "read" electrical potential) is applied across the memory device 30 from a higher to a lower electrical potential in the direction from electrode 36 to electrode 32. This electrical potential is less than the electrical potential $V_{pg}$ applied across the memory device 30 for programming (see above). In this situation, the memory device 30 will readily conduct current, which indicates that the memory device 30 is in its programmed state.

In order to erase the memory device 30, a positive voltage is applied to the electrode 32, while the electrode 36 is held at ground, so that an electrical potential $V_{er}$ (the "erase" electrical potential) is applied across the memory device 30 from a higher to a lower electrical potential in the direction of from electrode 32 to electrode 36.

In the read step of the memory device 30 in its erased (substantially non-conductive) state, the electrical potential $V_r$ is again applied across the memory device 30 from a higher to a lower electrical potential in the direction from electrode 36 to electrode 32 as described above. With the active layer 34 (and memory device 30) in a high-resistance or substantially non-conductive OFF state, the memory device 30 will not conduct significant current, which indicates that the memory device 30 is in its erased state.

It will be understood that it is highly desirable that the memory device, when programmed, be capable of retaining its programmed state for a long period of time, i.e., until it is desired that the state be changed to its erased state. Likewise, it is highly desirable that the memory device, when erased, be capable of retaining that state for a long period of time as chosen. (these are of particular interest if the device is to be used as a One-Time-Programmable (OTP) device). While the above described device is effective in operation, it has been found that over a period of time, the conductivity of the memory device can be significantly reduced, so that the memory device undesirably loses its programmed state.

Furthermore, it is typical that the formed memory device is subjected to high temperatures during subsequent semiconductor processing steps. It is important that all elements of the memory device be capable of withstanding these high temperatures without degradation in performance. In particular, depending on the material chosen, the active layer can be subject to degradation in performance due to the application thereto of the normal high temperatures involved in subsequent semiconductor processing steps. It is therefore of great interest that the active layer be of a material which is highly effective in operation, meanwhile maintaining high thermal stability.

Therefore, what is needed is an approach wherein these requirements are met.

DISCLOSURE OF THE INVENTION

Broadly stated, provided herein is a method of fabricating a metal-insulator-metal (MIM) device comprising providing a first electrode, providing a $Ta_2O_5$ layer on the first electrode, and providing a second electrode on the $Ta_2O_5$.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

FIGS. 13-15 are graphs illustrating performance characteristics of the present memory device; and FIGS. 16-18 are systems incorporating memory devices of the present type.

BEST MODE(S) FOR CARRYING OUT THE INVENTION

Reference is now made in detail to a specific embodiment of the present invention which illustrates the best mode presently contemplated by the inventors for practicing the invention.

Figure 1:
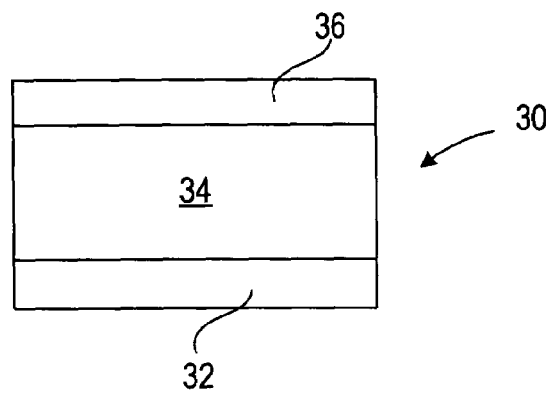
FIG. 1 is a cross-sectional view of an above-described memory device.
Figure 2:
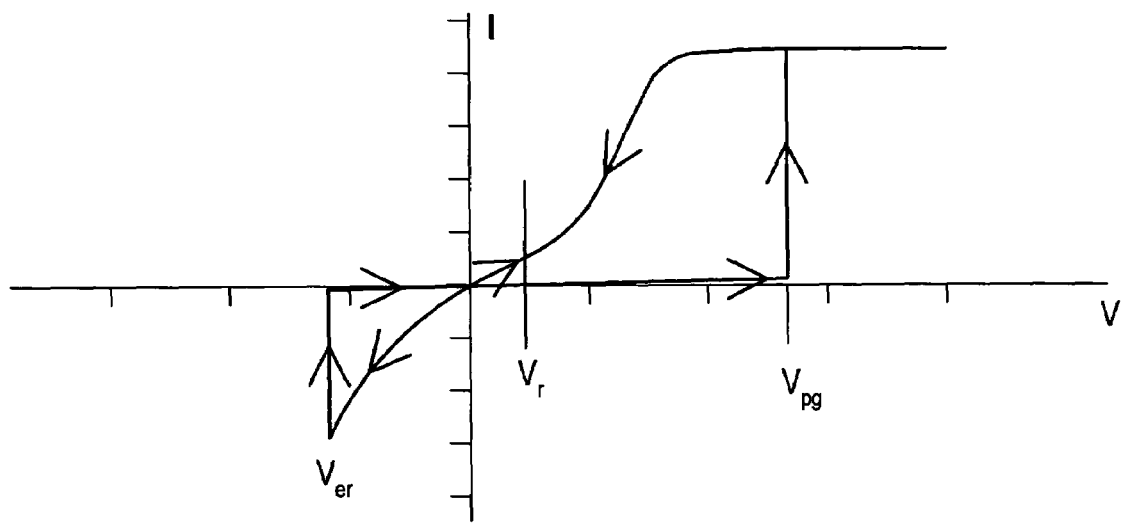
FIG. 2 is a plot of current vs. voltage illustrating operating characteristics of the memory device of FIG. 1.
Figure 3:
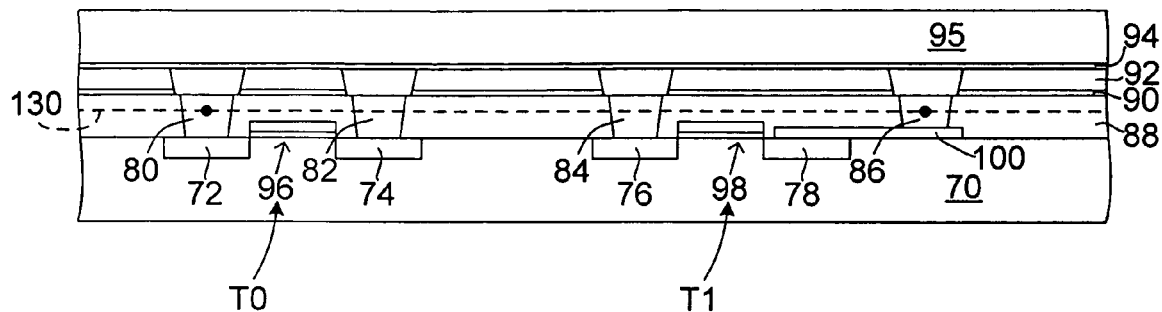
FIGS. 3-11 illustrate process steps in fabricating the present memory device.

With initial reference to FIG. 3, the structure thus far formed on a semiconductor wafer includes a p+ semiconductor substrate 70 having n+ regions 72, 74, 76, 78 formed therein. In contact with the respective n+ regions 72, 74, 76, 78 are conductive W plugs 80, 82, 84, 86 which extend through $SiO_2$ layer 88, SiN layer 90, and $SiO_2$ layer 92. Overlying the $SiO_2$ layer 92 and the tops of the W plugs 80, 82, 84, 86 is a SiN layer 94. The n+ regions 72, 74, along with gate and gate oxide 96, form a transistor T0, and the n+ regions 76, 78, along with gate and gate oxide 98, form a transistor T1. The plug 80 contacts the n+ source region 72 of the transistor T0, while the plug 82 contacts the n+ drain region 74 of the transistor T0. The plug 84 contacts the n+ drain region 76 of the transistor T1, while the plug 86, through W body 100 on the substrate 70, contacts the n+ source region 78 of the transistor T1.

Figure 4:
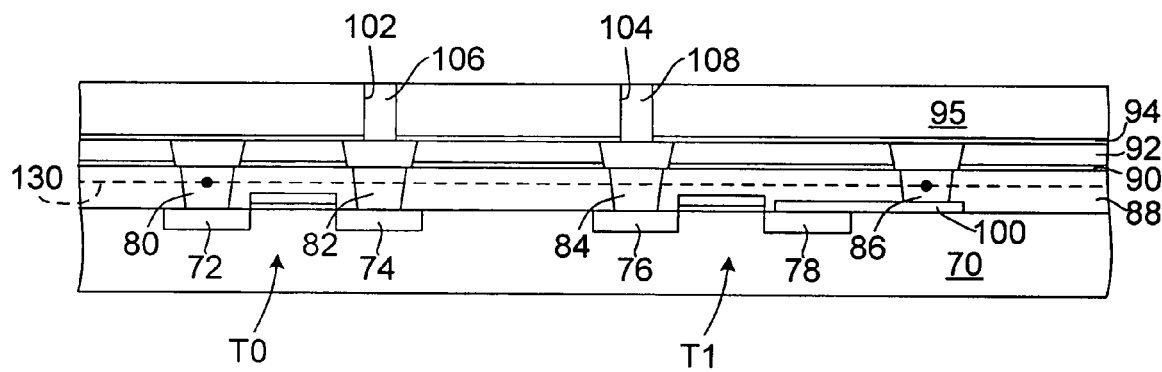
Figure 5:
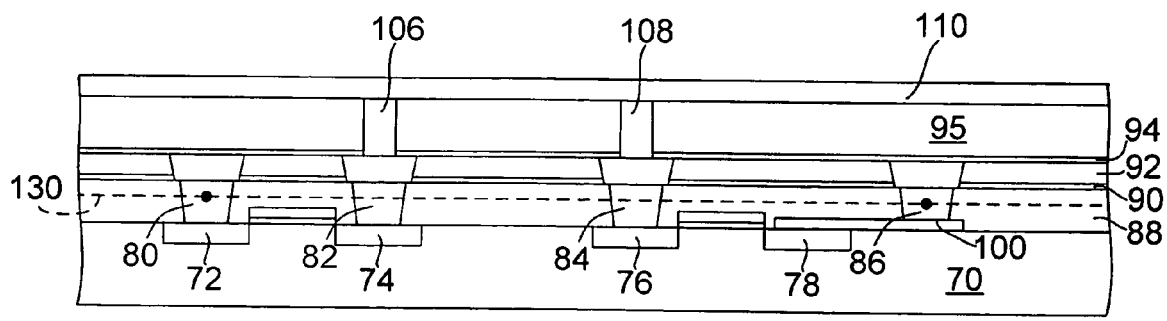

With reference to FIG. 4, using appropriate photolithographic techniques, openings 102, 104 are provided through the $SiO_2$ layer 95 and SiN layer 94 to the plugs 82, 84, and these openings 102, 104 are filled with conductive W plugs 106, 108. Next, with reference to FIG. 5, a bottom layer of α-Ta 110 is deposited using physical vapor deposition (PVD). During sequential processing steps without vacuum break in a multi-chamber PVD device such as Applied Materials Endura system, the structure is degassed at 150° C. Ar+ sputter etched to remove native W oxide from the W plug 106, 108 surfaces, deposited with 25 angstrom thick TaN (required for α-phase Ta nucleation), then deposited with 300 angstrom thick α-Ta 110.

Figure 6:
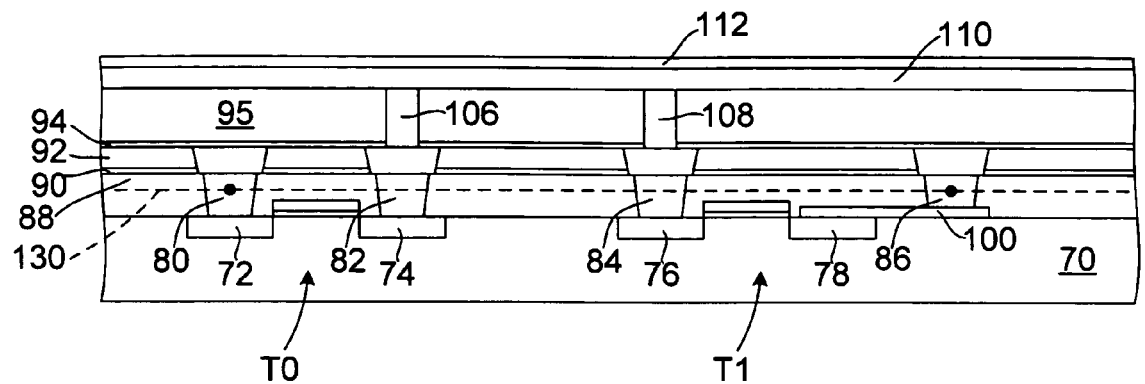

Next, the wafer is transferred to an oxidation chamber for growth of $Ta_2O_5$ 112 on the Ta layer 110 surface (FIG. 6). The oxidation chamber can be part of the PVD platform (for transfer without their exposure), or it can be a separate tool, such that exposure to the atmosphere will occur. Oxidation of metallic Ta films can be accomplished by any number of means, including thermal oxidation by $O_2$ at elevated temperatures (500° C.-800° C.), and reduced-pressure oxidation in an O-containing plasma at somewhat lower temperatures. In the present embodiment is used an $O_2$ established in a Gasonics photoresist asher, where the wafer is downstream of the glow discharge. The machine conditions used are 1) 250-270° C. wafer temperature, 2) 1100 W RF power, 3) 200 sccm $O_2$ flow, 4) 1.2 Torr pressure, 5) 10 min process time. The process grows ~12 nm Ta oxide with a gross stoichiometry of $Ta_2O_5$. The film is amorphous, with roughness out of 4 angstroms rms.

Figure 7:
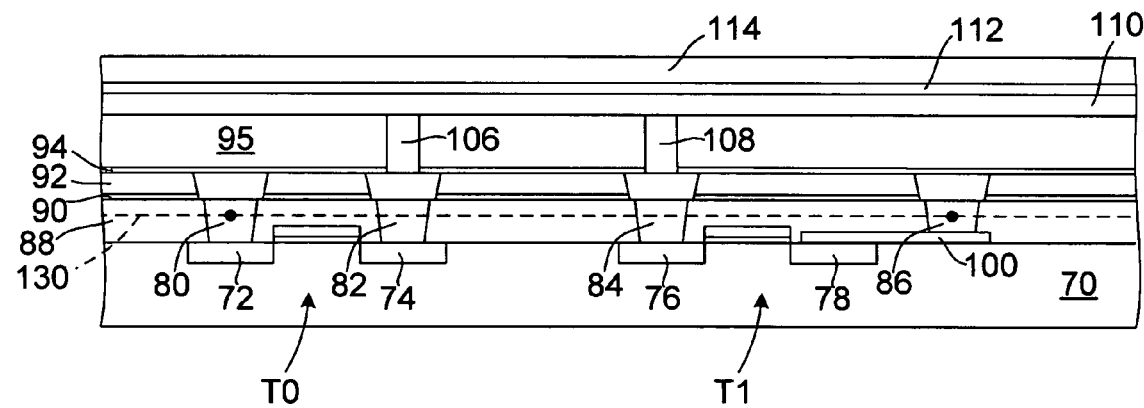

After $Ta_2O_5$ layer 112 is grown, the wafer is transferred back into the PVD deposition system described above, and a top layer 114 of β-Ta is deposited (FIG. 7). In the PVD system, the wafer sequences through degas followed by 300-500 angstroms thick deposition out of β-Ta. Ar+ high-end sputter etch is not used, since the grown $Ta_2O_5$ 112 layer must not be exposed to etch.

Figure 8:
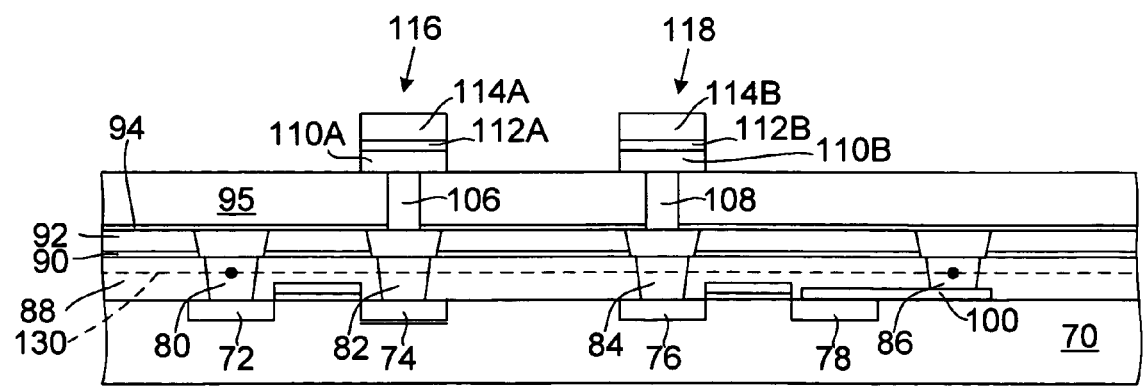

FIG. 8 illustrates the formation of the MIM devices 116, 118 using suitable photolithographic techniques. The resist pattern is transferred into the layer stack by reactive ion etching. A typical Cl-containing metal etch chemistry is employed to get completely through the layers 114, 112, 110, with the etch stopping at the $SiO_2$ layer 95 with the help of optical end point detection. Photoresist is stripped by a sequential $O_2$ plasma and organic solvent process. The device 116 includes electrode 110A in contact with plug 82, insulating layer 112A on and in contact with electrode 110A, and electrode 114A on and in contact with insulating layer 112A, so that the insulating layer 112A is between the electrode 110A and the electrode 114A. Likewise, the device 118 includes electrode 110B in contact with plug 84, insulating layer 112B on and in contact with electrode 110B, and electrode 114B on and in contact with insulating layer 112B.

Figure 9:
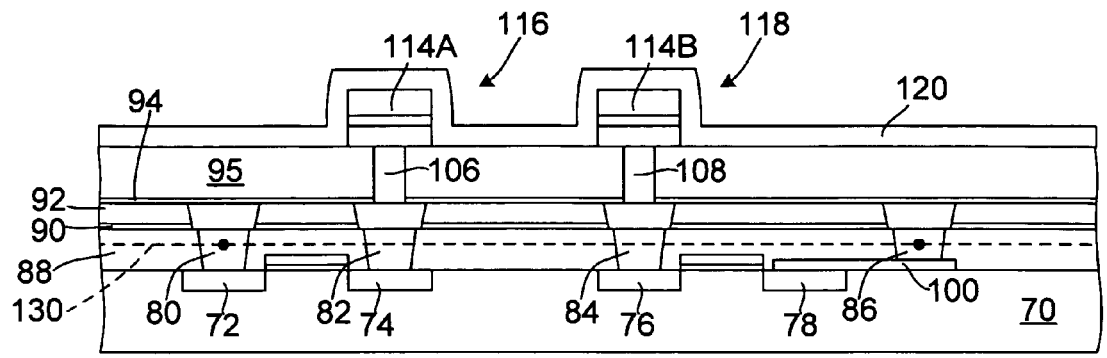
Figure 10:
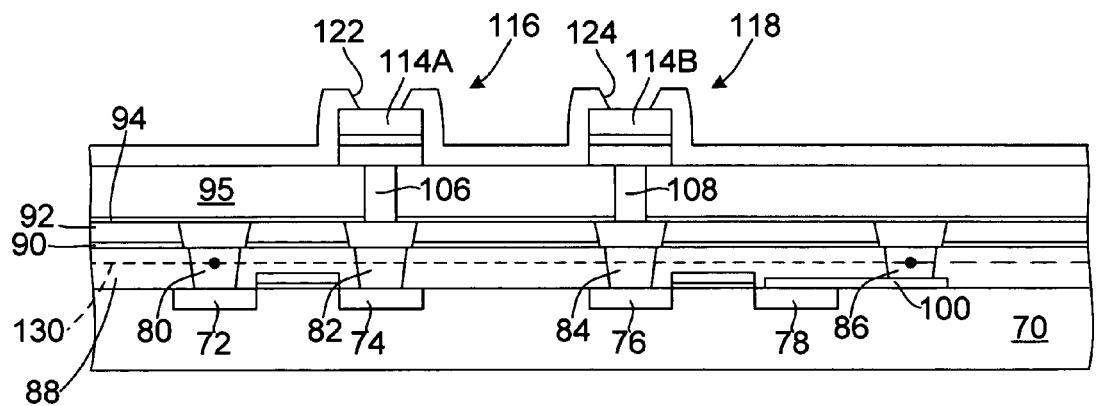
Figure 11:
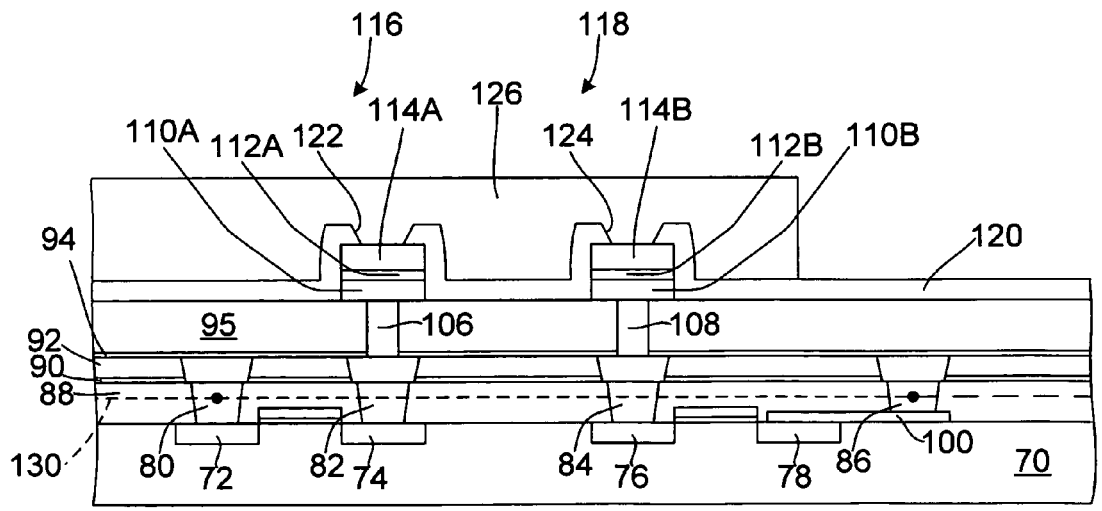
Figure 18:
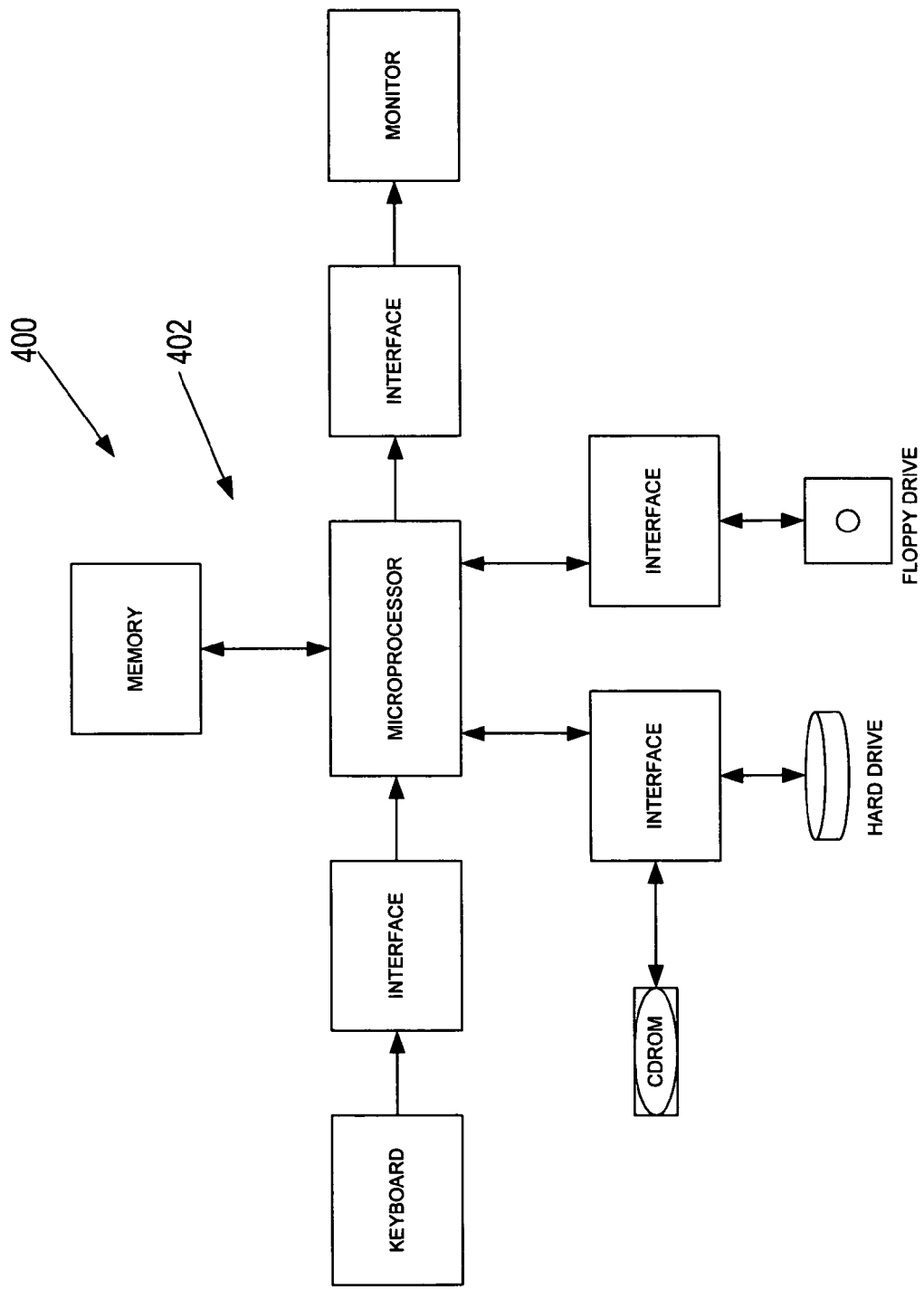

Next, a thin SiN insulating layer 120 is deposited over the resulting structure by plasma-enhanced deposition (FIG. 9). A thickness 500-1000 angstroms is used. Using suitable photolithographic techniques, the layer 120 is patterned as shown in FIG. 18, to provide openings 112, 124 therethrough to the respective electrodes 114A, 114B (FIG. 10). A metal layer 126 of Ti/TiN/Al(Cu) is then provided over the resulting structure after sputtering the native Ta oxide off of the tops of the electrodes 114A, 114B exposed by the openings, and is patterned as shown in FIG. 11, using appropriate photolithographic techniques. This metal layer 120 acts as a common plate (CP) to connect the electrodes 140A, 140B of the devices 116, 118, with the SiN remaining on the sides of each electrode-insulating layer-electrode stack ensuring that the bottom electrode of each device is isolated from the top electrode thereof.

Figure 12:
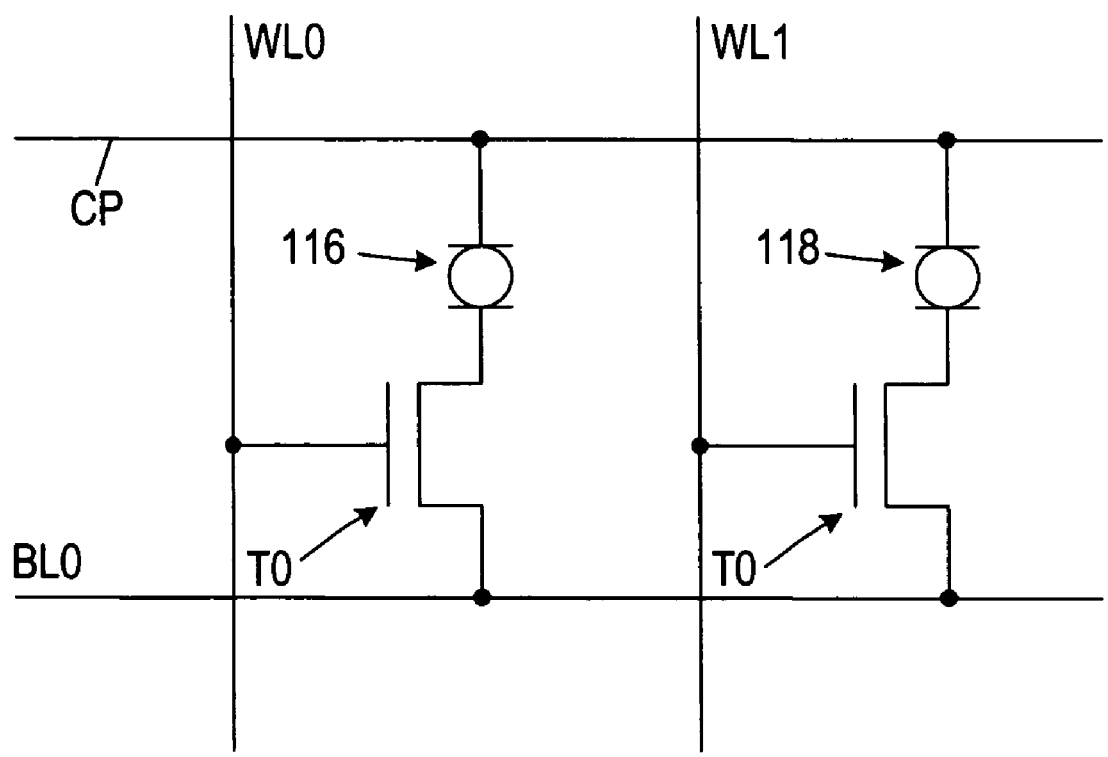
FIG. 12 is a schematic illustration of an array incorporating the present memory device.

In this structure, each of the memory devices 116, 118 is in series with a select transistor (T0, T1). The schematic illustration of the structure of FIG. 11 is shown in FIG. 12, with the gates of the transistors T0, T1 being the word lines WL0, WL1, and the bit line BL0 being a conductor 130 connecting the plugs 80, 86 which in turn contact the source regions 72, 78. It will be understood that the structure of FIG. 12 is a very small, illustrative part of the overall memory array.

As illustrated in FIG. 13, the Ta/$Ta_2O_5$/Ta device, operating as a One-Time-Programmable (OTP) device, can be switched from the high-resistance OFF state to the low-resistance ON state with a voltage below 4V. ON/OFF ratio can be more than two orders of magnitude, as illustrated in FIG. 14. Devices can be switched with AC pulses as short as 100 ns, indicating fast switching speed.

Programming yield was measured on a 32K memory test array. 100% programming yield can be achieved.

The Ta/$Ta_2O_5$/Ta MIM device has been baked at up to 250 C., showing no degradation in the ON state current. FIG. 15 is a plot of current vs. temperature for some typical devices in ON and OFF states through the bake test. ON state cells have no current loss at temperatures up to 250 C., indicating excellent data retention which is desirable for non-volatile applications. Retention was also measured directly by programming the 32K array and reading cell current after five days. The cells stably retained their ON state after five days.

It will be seen at the present device retains its selected ON and OFF states in a highly stable manner, without degradation of performance over a period of time.

FIG. 16 illustrates a system 200 utilizing memory devices as described above. As shown therein, the system 200 includes hand-held devices in the form of cell phones 202, which communicate through an intermediate apparatus such as a tower 204 (shown) and/or a satellite. Signals are provided from one cell phone to the other through the tower 204. Such a cell phone 202 with advantage uses memory devices of the type described above for data storage, for example names, telephone number and other data. One skilled in the art will readily understand the advantage of using such memory devices in other hand-held devices which utilize data storage, such as portable media players, personal digital assistants, digital cameras and the like.

FIG. 17 illustrates another system 300 utilizing memory devices as described above. The system 300 includes a vehicle 302 having an engine 304 controlled by an electronic control unit 306. The electronic control unit 306 with advantage uses memory devices of the type described above for data storage, for example data relating to engine and vehicle operating conditions.

FIG. 18 illustrates yet another system 400 utilizing memory devices as described above. This system 400 is a computer 402 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The memory with advantage uses memory devices of the type described above for storage of any data which is of use.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fabricating a metal-insulator-metal (MIM) device comprising:
   providing a first electrode;
   providing a Ta oxide layer on the first electrode; and
   providing a second electrode on the Ta oxide;
   wherein an electrode of the first and second electrodes comprises Ta.

2. The method of claim 1 wherein said electrode of the first and second electrodes is $\alpha$-Ta.

3. The method of claim 1 wherein the other of the first and second electrodes comprises Ta.

4. The method of claim 1 wherein said electrode of the first and second electrodes is $\beta$-Ta.

5. A method of fabricating a metal-insulator-metal (MIM) device comprising:
   providing a first electrode comprising Ta;
   oxidizing Ta of the first electrode to form a Ta oxide layer on the first electrode; and
   providing a second electrode on the Ta oxide layer.

6. The method of claim 5 wherein the first electrode is $\alpha$-Ta.

7. The method of claim 5 wherein the second electrode is $\beta$-Ta.

8. The method of claim 1 wherein the Ta oxide layer is $Ta_2O_5$.

9. The method of claim 8 and further comprising providing an insulating layer over and along the sides of the metal-insulator-metal (MIM) device.

10. The method of claim 9 and further comprising providing an opening through the insulating layer to the second electrode.

11. A method of fabricating a metal-insulator-metal (MIM) device comprising:
    providing a first electrode of $\alpha$-Ta;
    oxidizing Ta of the first electrode to form a $Ta_2O_5$ layer on the first electrode; and
    providing a second electrode of $\beta$-Ta on the $Ta_2O_5$ layer.

12. The method of claim 11 and further comprising providing an insulating layer over and along the sides of the metal-insulator-metal (MIM) device.

13. The method of claim 12 and further comprising providing an opening through the insulating layer to the second electrode.

14. The method of claim 1 and further comprising said device incorporated in a system.

15. The method of claim 14 wherein the system is selected from the group consisting of a hand-held device, a vehicle, and a computer.

* * * * *